United States Patent
Sagen et al.

(10) Patent No.: US 11,955,930 B1
(45) Date of Patent: Apr. 9, 2024

(54) LOW-CAPACITANCE FEEDFORWARD LEVEL-TRANSLATOR ARCHITECTURE FOR HIGH-SPEED MULTI-PHASE OSCILLATORS

(71) Applicant: Analog Devices, Inc., Wilmington, MA (US)

(72) Inventors: Eric A. Sagen, Colorado Springs, CO (US); Dheemanth Prabhu Hejamady, San Diego, CA (US)

(73) Assignee: Analog Devices, Inc., Wilmington, MA (US)

( * ) Notice: Subject to any disclaimer, the term of this patent is extended or adjusted under 35 U.S.C. 154(b) by 0 days.

(21) Appl. No.: 18/150,161

(22) Filed: Jan. 4, 2023

(51) Int. Cl.
*H03B 27/00* (2006.01)
*H03K 3/03* (2006.01)
*H03L 7/093* (2006.01)
*H03L 7/099* (2006.01)

(52) U.S. Cl.
CPC .......... *H03B 27/00* (2013.01); *H03K 3/0315* (2013.01); *H03L 7/093* (2013.01); *H03L 7/0995* (2013.01)

(58) Field of Classification Search
CPC ...... H03B 27/00; H03K 3/0315; H03L 7/093; H03L 7/0995
USPC ..................................... 331/57, 183
See application file for complete search history.

(56) References Cited

U.S. PATENT DOCUMENTS

2013/0335152 A1\* 12/2013 Burnette .......... H03K 3/356121
327/333

\* cited by examiner

*Primary Examiner* — Arnold M Kinkead
(74) *Attorney, Agent, or Firm* — Schwegman Lundberg & Woessner, P.A.

(57) ABSTRACT

This disclosure relates to multi-phase oscillators for electronic systems. An example system includes multiple level translator circuits and a ring oscillator circuit that includes multiple outputs. Each level translator circuit includes a first input transistor, a second input transistor, and an output. The ring oscillator circuit includes multiple outputs, and each output of the ring oscillator has a different phase. An output of the ring oscillator is coupled to only one input transistor of a level translator circuit, and the other input transistor of the level translator circuit is coupled to an output of another level translator circuit.

18 Claims, 7 Drawing Sheets

US 11,955,930 B1

LOW-CAPACITANCE FEEDFORWARD LEVEL-TRANSLATOR ARCHITECTURE FOR HIGH-SPEED MULTI-PHASE OSCILLATORS

FIELD OF THE DISCLOSURE

This document relates to electronic circuits for clock signal generation or clock signal recovery. Some embodiments relate to multi-phase oscillator circuits that can operate at high frequency.

BACKGROUND

Electronic systems sometimes use high frequency clock signals to manage timing in the systems. Some electronic systems can use circuits that synthesize clock signals. For example, an electronic system may require multiple clock signals having a well-controlled phase delay between them. A phase-locked loop (PLL) circuit can be used to generate the multiple clock signals from a reference clock signal. A PLL circuit may be required to operate at very high frequencies to support high frequency requirements of the electronic system.

SUMMARY OF THE DISCLOSURE

This document relates generally to multi-phase oscillator circuits. In some embodiments, a multi-phase oscillator circuit includes multiple level translator circuits and a ring oscillator circuit. Each level translator circuit includes a first input transistor, a second input transistor, and an output. The ring oscillator circuit includes multiple outputs, and each output of the ring oscillator has a different phase. An output of the ring oscillator is only coupled to one input transistor of a level translator circuit, and the other input transistor of the level translator circuit is coupled to an output of another level translator circuit.

In some embodiments, a phase lock loop (PLL) circuit includes an input to receive a reference oscillator signal and outputs to provide output clock signals; a feedback loop that corrects phase error between the output clock signal and the reference oscillator signal; and a multi-phase oscillator circuit to generate the output clock signals. The multi-phase oscillator circuit includes a ring oscillator circuit including multiple inverters connected in series in a ring, wherein a circuit supply of the inverters is a control voltage; and multiple level translator circuits, each level translator circuit including a first input transistor, a second input transistor, an output, and a connection to a circuit supply different from the circuit supply of the inverters. An output of an inverter of the ring oscillator circuit is coupled to the next inverter of the ring oscillator circuit and to only one input transistor of a level translator circuit, and the other input transistor of the level translator circuit is coupled to an output of another level translator circuit.

In some embodiments, a method of generating a level translated clock signal includes generating multiple phase output signals using a ring oscillator, adjusting a control signal to adjust one or both of a frequency and phase of the multiple phase output signals, and generating the level translated clock signal using a first level translator circuit by driving a first input transistor of the first level translator circuit using a phase output of the ring oscillator, and driving a second input transistor of the first level translator circuit using a previous phase output of the ring oscillator passed through another level translator circuit.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Electronic systems can include circuits that synthesize clock signals. For example, the clock signals can be used to control timing of analog-to-digital converters (ADCs) and digital-to-analog converters (DACs) of an electronic system. A multi-phase oscillator circuit can be used to generate dock signals for an electronic system.

Figure 1:
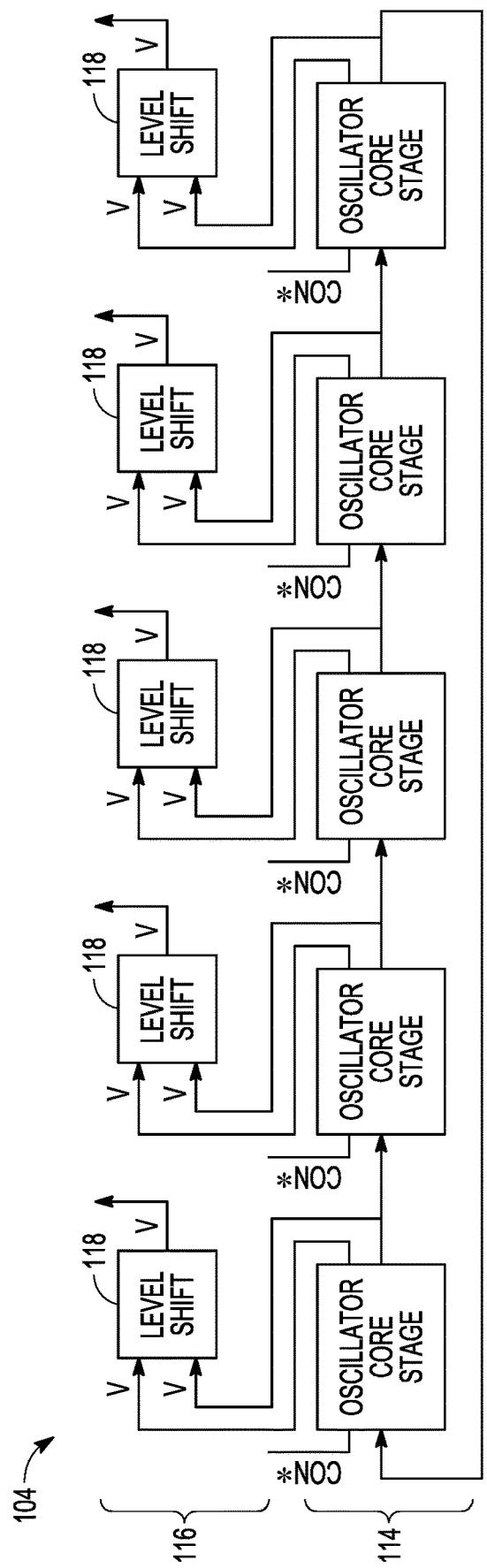
FIG. 1 is a block diagram of an example of a multi-phase oscillator circuit.

FIG. 1 is a block diagram of an example of a multi-phase oscillator circuit 104. The circuit includes an oscillator portion 114 and a level translator portion 116. The oscillator portion 114 can be included in an integrated circuit (IC) core. The devices of the IC core may operate using a different circuit supply than the rest of the circuits of the IC. One or both of the frequency and the phase of the signals output from the oscillator portion 114 can be adjusted by the control voltage input to the VCO circuit 104.

The voltage of the output signals of the oscillator portion 114 vary between zero volts and the control voltage. The control voltage is lower than the voltage used by the rest of the system. For this reason, the output of the oscillator portion 114 of the multi-phase oscillator circuit 104 is fed to a level translator that converts the output signal to the voltage level (VDD) of the rest of the electronic system. In an example intended to be illustrative and non-limiting, the control voltage may be one volt or less, and VDD may be 1.8 volts.

The oscillator portion 114 can include a ring oscillator circuit having multiple oscillator stages connected in series in a ring. The example in FIG. 1 includes five oscillator stages, but in general the ring oscillator can include N oscillator stages, where N is an integer greater than two. Each oscillator stage provides an output having a different phase. In the example of FIG. 1, the ring oscillator circuit provides five output signals; one for each oscillator stage.

The level translator portion includes five level translator circuits 118; one for each output from the oscillator portion 114. The level translator circuits 118 may convert the output signals at the control voltage (CON) to the circuit rail (VDD) of the rest of the electronic system.

Figure 2:
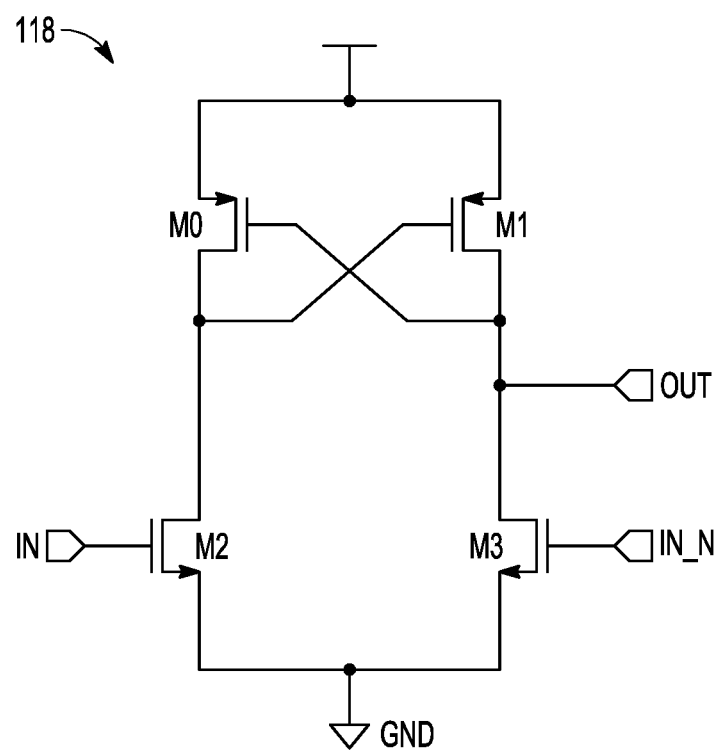
FIG. 2 is a circuit diagram of a level translator circuit.

FIG. 2 is a circuit diagram of an example of a level translator circuit 118. Each level translator includes an input (IN), a complementary input (IN_N), and an output (OUT). The output phase signal from an oscillator stage to be converted is applied to the input and the output from a previous oscillator stage can be applied to the complementary input. The output of the level translator circuit provides the output phase signal converted to the VDD voltage It can be seen from the circuit diagrams of FIGS. 1 and 2 that each oscillator stage of the ring oscillator circuit drives three loads: the next oscillator stage of the ring oscillator circuit, the input of a level translator circuit 118, and the complementary input of a level translator circuit 118. In FIG. 2, the input and complementary input of the level translator circuit 118 are connected to the gates of n-type field effect transistors (FETs).

Each of the loads adds capacitance to the output of an oscillator stage of the ring oscillator circuit. The amount of capacitance that each oscillator output drives limits the highest frequency achievable by the ring oscillator circuit. Additionally, the more devices that the oscillator stages of the ring oscillator circuit have to drive contributes to additional signal jitter in the output signals and decreased matching of the individual phase outputs of the ring oscillator circuit.

Figure 3:
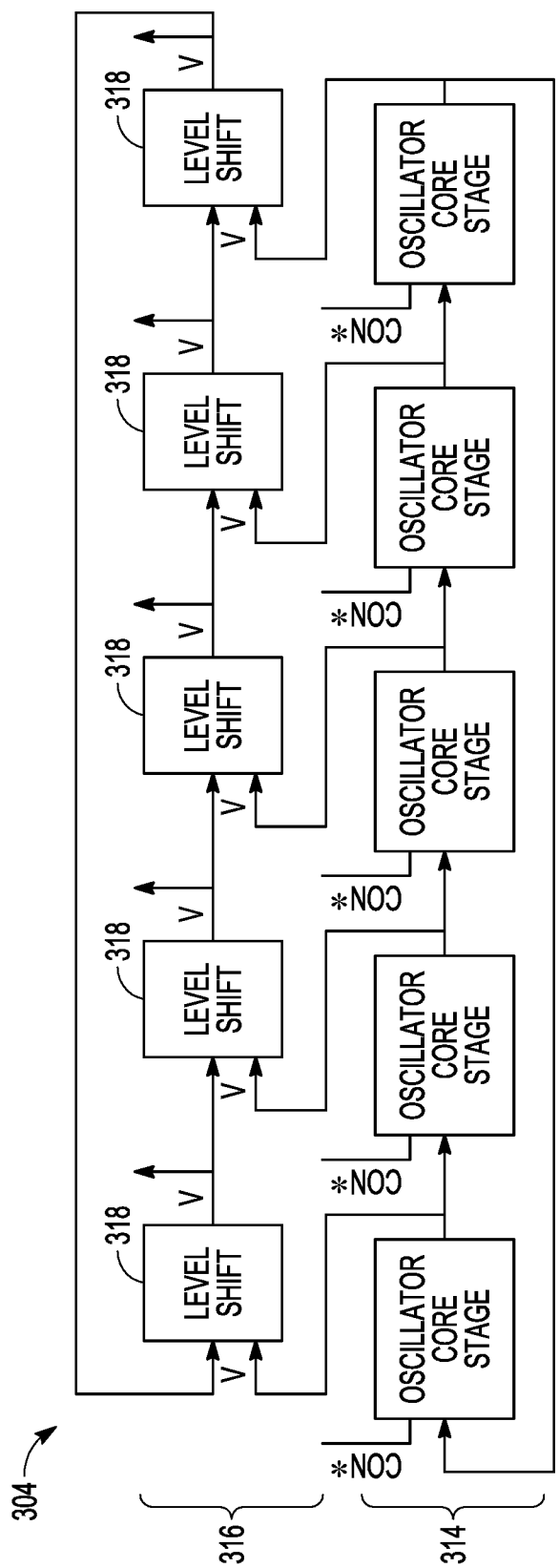
FIG. 3 is a block diagram of another example of a multi-phase oscillator circuit.

FIG. 3 is a circuit schematic of another example of a multi-phase oscillator circuit 304. The circuit again includes an oscillator portion 314 and a level translator portion 316. The oscillator portion can again be a ring oscillator circuit of five oscillator stages connected in series in a ring. The circuit supply for the oscillator stages can be the voltage of the control signal (CON) or a voltage supply of the IC core. The level translator portion 316 can include five level translator circuits 318. The level translator circuits 318 are different from the translator circuits of the example of FIGS. 1 and 2.

Figure 4:
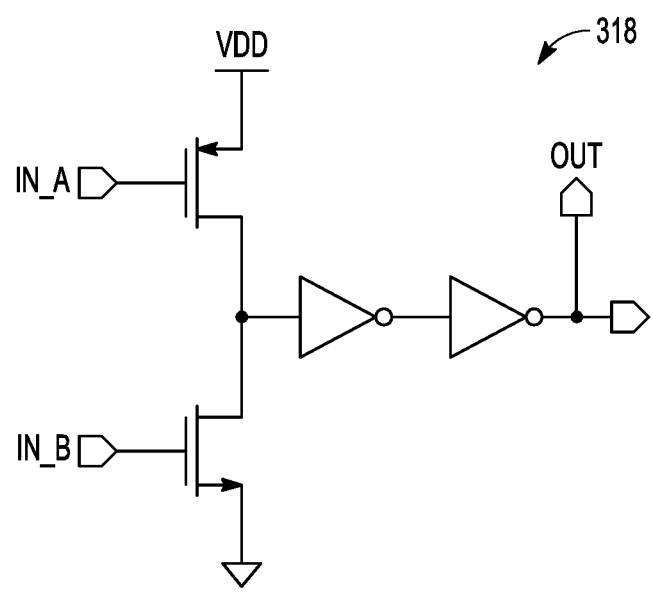
FIG. 4 is a circuit diagram of another example of a level translator circuit.

FIG. 4 is a circuit diagram of an example of a level translator circuit 318 that can be used in the multi-phase oscillator circuit of FIG. 3. The level translator circuit 318 includes one pull-down device and one pull-up device. In the example of FIG. 3, the devices are input transistors and the pull-down device is an n-type FET and the pull-up device is a p-type FET. The pull-down and pull-up devices pull a circuit node (M) to ground or VDD, and the circuit node is connected to an output buffer of the level translator circuit 318. In the example of FIG. 3, the circuit node is connected to the drain region of the n-type FET and the drain region of the p-type FET. The control input (IN B) of the pull-down device is connected to the output of an oscillator stage of a phase output signal that is to be converted. The control input (IN A) of the pull-up device is a feed forward input connected to the output of the level translator circuit 318 of the previous phase output signal. The output (OUT) of the level shifter provides an output of the multi-phase oscillator circuit 304 and is also the feed forward output to another oscillator stage.

Figure 5:
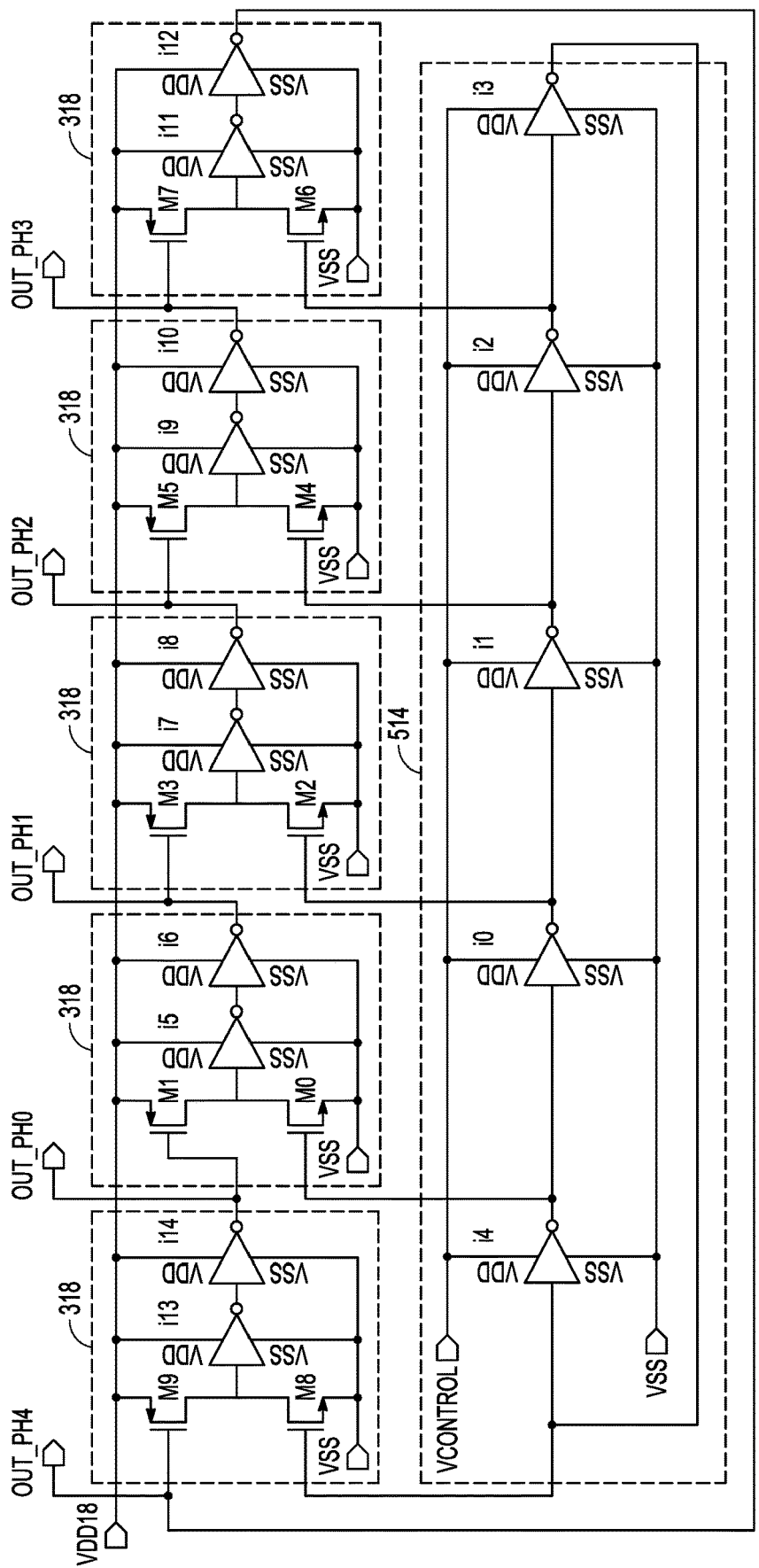
FIG. 5 is a circuit schematic of another example of a multi-phase oscillator circuit.

FIG. 5 is a more detailed circuit diagram of the multi-phase oscillator circuit of FIG. 3. The oscillator portion is a ring oscillator circuit 514 that includes five inverter stages connected in a ring. In the circuit approach of FIG. 5, an output of the ring oscillator circuit 514 only drives one input transistor of a level translator circuit 318. Compared to the example of FIG. 1, the inverters of the ring oscillator of FIG. 5 only drive the next inverter of the ring oscillator circuit 514 and one n-type FET. Thus, the load on one output of the ring oscillator circuit 514 is reduced by one input transistor, and the capacitance on the inverters of the ring oscillator circuit 514 is reduced.

As in the example of FIG. 1, the multi-stage oscillator circuits of FIGS. 3 and 5 may have N stages to provide N output signals evenly spaced apart in phase. Because there are less devices connected to an oscillator stage of the ring oscillator, the approach in FIGS. 3 and 5 may provide better matching of the load and therefore better matching and accurate spacing of the output signals. The reduced capacitance on the oscillator stages allows the ring oscillator circuit to be driven with higher frequencies than the version of FIG. 1. Also, because the propagation delay from an oscillator stage output of the ring oscillator circuit to the pull-down device is less than the propagation delay from the output of the previous oscillator stage through another level translator circuit to the pull-up device, the switching of the input transistors at the level translator circuit is non-overlapping, which minimizes the chance of shott-through current through the transistors.

Figure 6:
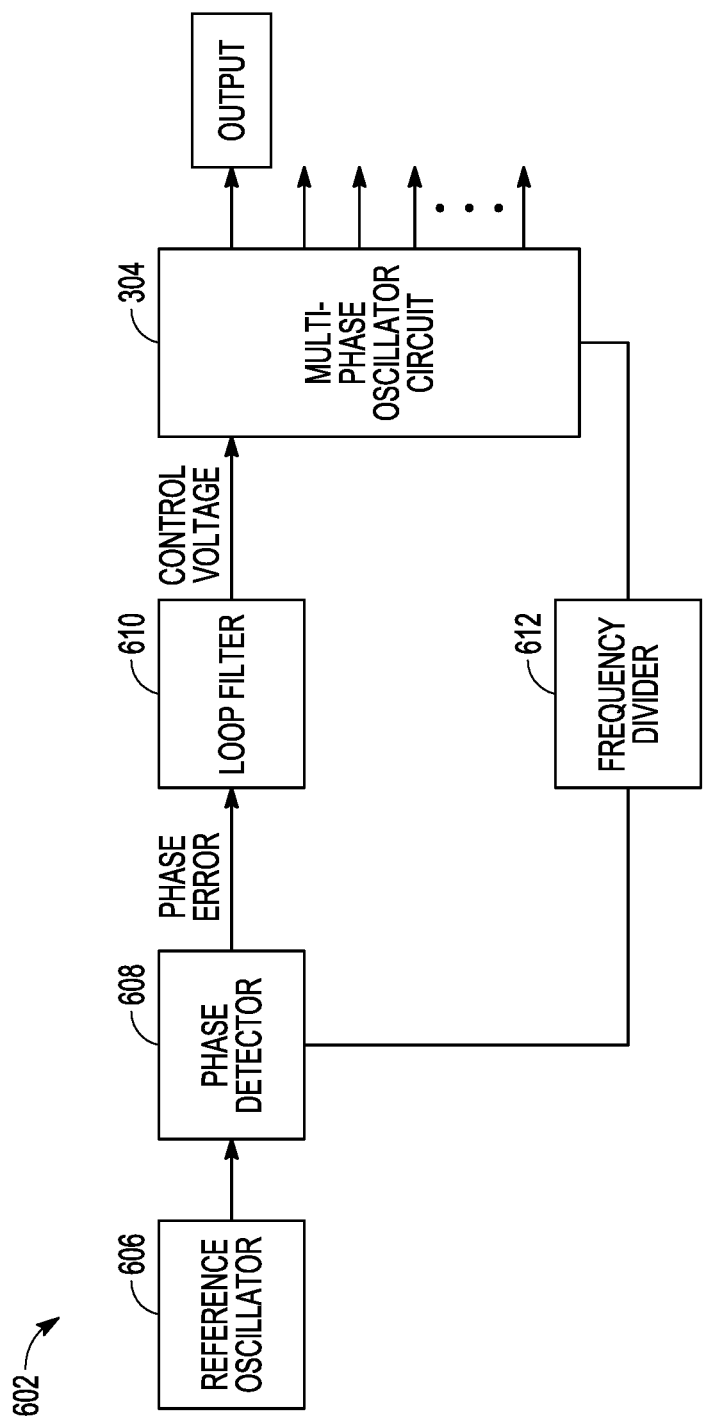
FIG. 6 is a block diagram of an example of a phase locked loop (PLL) circui.

A phased locked loop (PLL) circuit can be used to generate clock signals for an electronic system, such as when clock signal recovery is needed in the system. FIG. 6 is a block diagram of a PLL circuit 602. The PLL circuit 602 includes a feedback loop and a multi-phase oscillator circuit 304 (e.g., the multi-phase oscillator circuit 304 of FIG. 3). The multi-phase oscillator circuit 304 may be a voltage-controlled oscillator (VCO) circuit. The multi-phase oscillator circuit 304 outputs an oscillation signal whose frequency and phase is controlled by a control signal (e.g., control voltage). The feedback loop provides negative feedback to match an output of the multi-phase oscillator circuit 304 to the reference oscillator 606. The reference oscillator 606 can be a crystal oscillator or another type of onboard oscillator.

The feedback loop includes a phase detector circuit 608 that generates a phase error signal proportional to the difference in phase between the reference oscillator 606 and the multi-phase oscillator circuit 304. The feedback loop can also include a loop filter circuit 610 (e.g., a low pass filter circuit) that processes the phase error signal to produce the control voltage for the multi-phase oscillator circuit 304. The feedback loop can include a frequency divider circuit 612 that feeds back a frequency divided version of the output clock from the multi-phase oscillator circuit 304. The feedback loop adjusts the multi-phase oscillator circuit 604 outputs to reduce the error between the frequency divider output and the reference oscillator. When the phase error signal indicates that the error is zero (or at least constant) the PLL circuit is in a locked condition and the output signal is in phase and frequency lock with the input reference signal.

For a given electronic system using a PLL circuit 602 to generate clock signals and also needing high frequency multi-phase operation, the multi-phase oscillator circuit 304 is able to operate at a very high frequency to support the highest frequency of the electronic system. The multi-phase oscillator circuit 304 also operates with a wide lock-in voltage range for the control voltage, and the voltage output of the multi-phase oscillator circuit 304 matches the voltage used by the rest of the electronic system.

Figure 7:
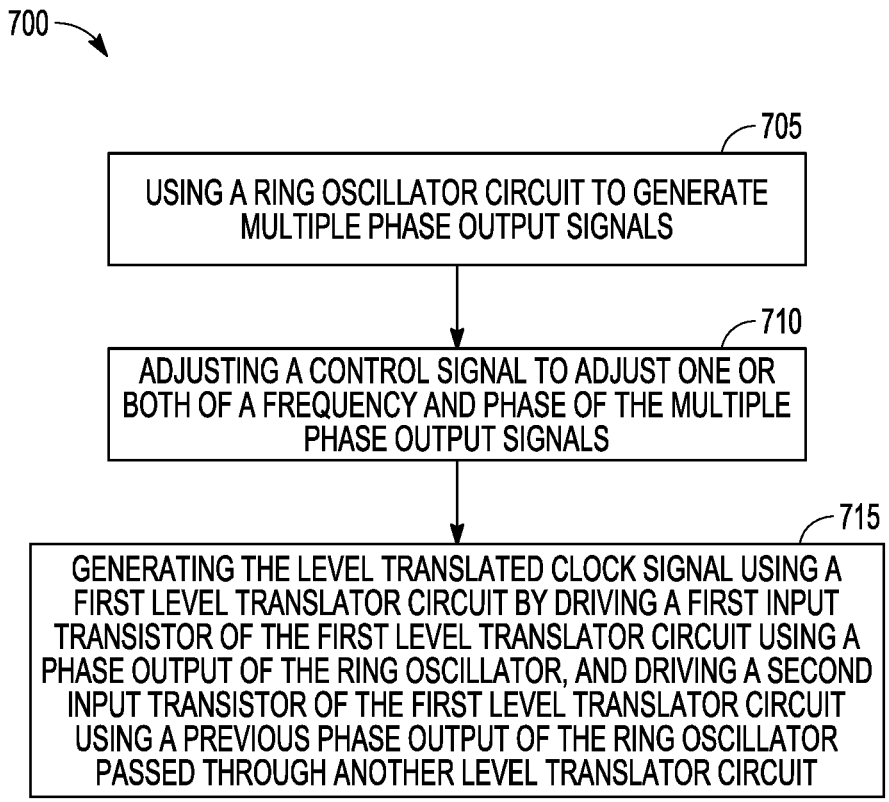
FIG. 7 is a flow diagram of an example of a method of generating a level translated clock signal.

For completeness, FIG. 7 is a flow diagram of an example of a method 700 of generating a level translated clock signal. At block 705, a ring oscillator circuit generates multiple phase output signals at a first voltage level. In some examples, the ring oscillator circuit is included in a PLL circuit and the first voltage level is a control voltage. At optional block 710, the first voltage level is optionally changed to adjust one or both of a frequency and phase of the multiple phase output signals. The first voltage level may be generated using a phase detector and loop circuit to reduce an error between the generated level translated clock signal and a reference clock signal.

At block 715, the level translated clock signal is generated using a first level translator circuit. A first input transistor of the first level translator circuit is driven using a phase output of the ring oscillator, and driving a second input transistor of the first level translator circuit is driven using a previous phase output of the ring oscillator passed through a second level translator circuit. In some example, the first input transistor includes a pull-down transistor of the level translator circuit to pull a circuit node of the level translator circuit to a circuit ground, and the second input transistor is a pull-up transistor to pull the circuit node up to a circuit supply rail. A signal from the circuit node is applied to an output buffer of the first level translator circuit.

The circuits and methods described include techniques for design of high speed multi-phase oscillator circuits. The number of devices is reduced thereby reducing capacitance in the circuits to allow higher operating frequencies. The reduced number of devices provides improved jitter performance and better matching of phases of output signals of the multi-phase output circuits.

EXAMPLES AND ADDITIONAL DESCRIPTION

Example 1 includes subject matter (such as a multiphase oscillator circuit) comprising multiple level translator circuits, each level translator circuit including a first input transistor, a second input transistor, and an output; a ring oscillator circuit including multiple outputs, wherein each output of the ring oscillator has a different phase; and wherein an output of the ring oscillator is only coupled to one input transistor of a level translator circuit, and the other input transistor of the level translator circuit is coupled to an output of another level translator circuit.

In Example 2, the subject matter of Example 1 optionally includes a ring oscillator circuit includes multiple stages and a control voltage input; and a first circuit supply for the multiple stages of the ring oscillator circuit, and the level translator circuit is connected to a second circuit supply rail.

In Example 3, the subject matter of one or both of Example 1 and Example 2 optionally includes a second circuit supply rail that has a voltage higher than the control voltage input.

In Example 4, the subject matter of one or any combination of Examples 1-3 optionally includes N level translator circuits, wherein N is an integer greater than one; a ring oscillator circuit includes N stages connected in a ring, each stage providing one output of N outputs of the ring oscillator to one level translator circuit of the N level translator circuits; and wherein an output of one stage of the ring oscillator is connected to only one input transistor of the level translator circuit for that stage, and the other input transistor of the level translator circuit for that stage is connected to the output of the level translator circuit of the previous stage.

In Example 5, the subject matter of one or any combination of Examples 1~4 optionally includes the first and second input transistors of a level translator circuit are complementary-type field effect transistors (FETS), and wherein the output of the ring oscillator is coupled to only a gate input of the one input transistor of the level translator circuit.

In Example 6, the subject matter of Example 5 optionally includes the first input transistor of a level translator circuit is an n-type FET, and the second input transistor is a p-type FET.

In Example 7, the subject matter of one or both of Examples 5 and 6 optionally includes the drain regions of the first and second input transistors of the level translator circuits being connected to a circuit node, and the circuit node is connected to an output buffer of the level translator circuits.

In Example 8, the subject matter of one or any combination of Examples 1-7 optionally includes the outputs of the multiple level translator circuits being multi-phase outputs of the multi-phase oscillator circuit.

In example 9, the subject matter of one or any combination of Examples 1-8 optionally includes the first input transistor of the level translator circuits being a pull-down transistor to pull a circuit node of the level translators circuit to a circuit ground, and the second input transistor is a pull-up transistor to pull the circuit node up to a circuit supply rail, and wherein the circuit node is connected to an output buffer of the level translator circuits.

In Example 10, the subject matter of one or any combination of Examples 1-9 optionally includes a propagation delay from a first output of the ring oscillator circuit to the pull-down transistor of the level translator circuits is less than a propagation delay from the other output of the ring oscillator to the pull-up transistor of the level translator circuits.

Example 11 includes subject matter (such as a phase-locked loop (PLL) circuit) or can optionally be combined with one or any combination of Examples 1-10 to include such subject matter, comprising an input to receive a reference oscillator signal and an output to provide an output clock signal; a feedback loop that corrects phase error between the output clock signal and the reference oscillator signal; and a multi-phase oscillator circuit to generate the output clock signal. The multi-phase oscillator circuit includes a ring oscillator circuit including multiple inverters connected in series in a ring, wherein a circuit supply of the inverters is a control voltage; multiple level translator circuits, each level translator circuit including a first input transistor, a second input transistor, an output, and a connection to a circuit supply different from the circuit supply of the inverters; and wherein an output of an inverter of the ring oscillator circuit is coupled to the next inverter of the ring oscillator circuit and to only one input transistor of a level translator circuit, and the other input transistor of the level translator circuit is coupled to an output of another level translator circuit.

In Example 12, the subject matter of Example 11 optionally includes the multiple level translator circuits including N level translator circuits, wherein N is a positive integer greater than three; wherein the ring oscillator circuit includes N inverter stages, each inverter providing one output of N outputs of the ring oscillator to one level translator circuit of the N level translator circuits; and wherein an output of an inverter is connected to only one input transistor of the level translator circuit for that inverter stage, and the other input transistor of the level translator circuit for that inverter stage is connected to the output of the level translator circuit of the previous inverter stage.

In Example 13, the subject matter of one or any combination of Examples 11 and 12 optionally includes the first and second input transistors of the level translator circuit are complementary-type field effect transistors (FETS), and wherein the output of the inverter is coupled to the next inverter of the ring oscillator and to only a gate input of the one input transistor of the level translator circuit.

In Example 14, the subject matter of Example 13 optionally includes the first and second input transistors of the level translator circuit being complementary-type field effect transistors (FETS), and wherein the output of the inverter is coupled to the next inverter of the ring oscillator and to only a gate input of the one input transistor of the level translator circuit.

In Example 15, the subject matter of one or both of Examples 13 and 14 optionally includes one of the first and second input transistors of the level translator circuit is an n-type FET, and the other input transistor of the level translator circuit is a p-type FET.

In Example 16, the subject matter of one or any combination of Examples 11-15 optionally includes the outputs of the multiple level translator circuits are multi-phase outputs of the PLL circuit.

In Example 17, the subject matter of one or any combination of Examples 11-16 optionally includes a feedback loop including: a phase detector circuit configured to detect the phase error between the output clock signal and the reference oscillator signal phase error; and a loop filter circuit coupled to the phase detector circuit and configured to adjust the circuit supply of the inverters according to the phase error.

Example 18 includes subject matter (such as a method of generating a level translated clock signal) or can optionally be combined with one or any combination of Examples 1-17 to include such subject matter, comprising generating multiple phase output signals using a ring oscillator circuit; and generating the level translated clock signal using a first level translator circuit by driving a first input transistor of the first level translator circuit using a phase output of the ring oscillator, and driving a second input transistor of the first level translator circuit using a previous phase output of the ring oscillator passed through another level translator circuit.

In Example 19, the subject matter of Example 18 optionally includes receiving a first voltage level from a phase detector circuit; and adjusting the first voltage level to reducing an error between the generated level translated clock signal and a reference clock signal.

In Example 20, the subject matter of one or both of Examples 18 and 19 optionally includes driving a pull-down transistor of the level translator circuit to pull a circuit node of the level translator circuit to a circuit ground; and driving a pull-up transistor to pull the circuit node up to a circuit supply rail and providing a signal from the circuit node to an output buffer of the first level translator circuit.

These non-limiting examples can be combined in any permutation or combination.

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A multi-phase oscillator circuit, the circuit comprising:
   multiple level translator circuits, each level translator circuit including a first input transistor, a second input transistor, and an output;
   a ring oscillator circuit including multiple stages, a control voltage input, and multiple outputs, wherein each output of the ring oscillator has a different phase;
   wherein the control voltage input is a first circuit supply for the multiple stages of the ring oscillator circuit; and
   wherein an output of the ring oscillator is only coupled to one input transistor of a level translator circuit, and the other input transistor of the level translator circuit is coupled to an output of another level translator circuit and the level translator circuit is connected to a second circuit supply rail.

2. The circuit of claim 1, wherein the second circuit supply rail has a voltage higher than the control voltage input.

3. The circuit of claim 1, wherein the multiple level translator circuits include N level translator circuits,
   wherein N is an integer greater than one;
   wherein the ring oscillator circuit includes N stages connected in a ring, each stage providing one output of N outputs of the ring oscillator to one level translator circuit of the N level translator circuits; and wherein an output of one stage of the ring oscillator is connected to only one input transistor of the level translator circuit for that stage, and the other input transistor of the level translator circuit for that stage is connected to the output of the level translator circuit of the previous stage.

4. The circuit of claim 1, wherein the first and second input transistors of the multiple level translator circuits are complementary-type field effect transistors (FETS), and wherein the output of the ring oscillator is coupled to only a gate input of the one input transistor of a level translator circuit of the multiple level translator circuits.

5. The circuit of claim 4, wherein the first input transistor of the multiple level translator circuits is an n-type FET, and the second input transistor of the multiple level translator circuits is a p-type FET.

6. The circuit of claim 4, wherein drain regions of the first and second input transistors of the level translator circuit are connected to a circuit node, and the circuit node is connected to an output buffer of the level translator circuit.

7. The circuit of claim 1, wherein the outputs of the multiple level translator circuits are multi-phase outputs of the multi-phase oscillator circuit.

8. The circuit of claim 1, wherein the first input transistor is a pull-down transistor to pull a circuit node of the level translator circuit to a circuit ground, and the second input transistor is a pull-up transistor to pull the circuit node up to a circuit supply rail, and wherein the circuit node is connected to an output buffer of the level translator circuit.

9. The circuit of claim 8, wherein a propagation delay from a first output of the ring oscillator circuit to the pull-down transistor of the level translator circuits is less than a propagation delay from the other output of the ring oscillator to the pull-up transistor of the level translator circuits.

10. A phase lock loop (PLL) circuit, the PLL circuit comprising:
an input to receive a reference oscillator signal and an output to provide an output clock signal;
a feedback loop that corrects phase error between the output clock signal and the reference oscillator signal; and
a multi-phase oscillator circuit to generate the output clock signal, the multi-phase oscillator circuit including:
a ring oscillator circuit including multiple inverters connected in series in a ring, wherein a circuit supply of the inverters is a control voltage;
multiple level translator circuits, each level translator circuit including a first input transistor, a second input transistor, an output, and a connection to a circuit supply different from the circuit supply of the inverters; and
wherein an output of an inverter of the ring oscillator circuit is coupled to the next inverter of the ring oscillator circuit and to only one input transistor of a level translator circuit, and the other input transistor of the level translator circuit is coupled to an output of another level translator circuit.

11. The PLL circuit of claim 10, wherein the multiple level translator circuits include N level translator circuits, wherein N is a positive integer greater than three;
wherein the ring oscillator circuit includes N inverter stages, each inverter providing one output of N outputs of the ring oscillator to one level translator circuit of the N level translator circuits; and
wherein an output of an inverter is connected to only one input transistor of the level translator circuit for that inverter stage, and the other input transistor of the level translator circuit for that inverter stage is connected to the output of the level translator circuit of the previous inverter stage.

12. The PLL circuit of claim 10, wherein the first and second input transistors of a level translator circuit of the multiple level translator circuits are complementary-type field effect transistors (FETS), and wherein the output of the inverter is coupled to the next inverter of the ring oscillator and to only a gate input of the one input transistor of the level translator circuit.

13. The PLL circuit of claim 12, wherein drain regions of the first and second input transistors of the level translator circuit are connected to a circuit node, and the circuit node is connected to an output buffer of the level translator circuit.

14. The PLL circuit of claim 12, wherein one of the first and second input transistors of the level translator circuit is an n-type FET, and the other input transistor of the level translator circuit is a p-type FET.

15. The PLL circuit of claim 10, wherein the outputs of the multiple level translator circuits are multi-phase outputs of the PLL circuit.

16. The PLL circuit of claim 10, wherein the feedback loop includes:
a phase detector circuit configured to detect the phase error between the output clock signal and the reference oscillator signal phase error; and
a loop filter circuit coupled to the phase detector circuit and configured to adjust the circuit supply of the inverters according to the phase error.

17. A method of generating a level translated clock signal, the method comprising:
generating multiple phase output signals using a ring oscillator circuit;
generating the level translated clock signal using a first level translator circuit by driving a first input transistor of the first level translator circuit using a phase output of the ring oscillator, and driving a second input transistor of the first level translator circuit using a previous phase output of the ring oscillator passed through another level translator circuit;
receiving a first voltage level from a phase detector circuit; and
adjusting the first voltage level to reducing an error between the generated level translated clock signal and a reference clock signal.

18. The method of claim 17, wherein driving the first input transistor includes driving a pull-down transistor of the level translator circuit to pull a circuit node of the level translator circuit to a circuit ground, and wherein driving the second input transistor includes driving a pull-up transistor to pull the circuit node up to a circuit supply rail and providing a signal from the circuit node to an output buffer of the first level translator circuit.

* * * * *